(12) United States Patent
Hiramatsu et al.

(10) Patent No.: US 8,981,917 B2
(45) Date of Patent: Mar. 17, 2015

(54) IN-VEHICLE EMERGENCY REPORT APPARATUS

(71) Applicant: Denso Corporation, Kariya, Aichi-perf. (JP)

(72) Inventors: Seiichirou Hiramatsu, Obu (JP); Yuji Sato, Kariya (JP)

(73) Assignee: Denso Corporation, Kariya (JP)

( * ) Notice: Subject to any disclaimer, the term of this patent is extended or adjusted under 35 U.S.C. 154(b) by 139 days.

(21) Appl. No.: 13/659,200

(22) Filed: Oct. 24, 2012

(65) Prior Publication Data

US 2013/0106594 A1   May 2, 2013

(30) Foreign Application Priority Data

Oct. 27, 2011  (JP) ................................ 2011-235982
Aug. 10, 2012  (JP) ................................ 2012-178214

(51) Int. Cl.
| | |
|---|---|
| B60Q 1/00 | (2006.01) |
| B60L 3/00 | (2006.01) |
| H02J 7/34 | (2006.01) |
| H02J 9/00 | (2006.01) |
| H02J 9/06 | (2006.01) |
| B60R 21/01 | (2006.01) |

(Continued)

(52) U.S. Cl.
CPC ..... *B60L 3/0007* (2013.01); *B60R 2021/01252* (2013.01); *G01R 19/16542* (2013.01); *G01R 31/3689* (2013.01); *G01R 31/007* (2013.01); *H02J 7/34* (2013.01); *H02J 9/002* (2013.01); *H02J 9/06* (2013.01); *Y02T 90/16* (2013.01)
USPC ... 340/436; 340/904; 340/539.18; 340/425.5; 320/134

(58) Field of Classification Search
USPC ........... 340/904, 436, 539.18, 425.5; 320/134
See application file for complete search history.

(56) References Cited

U.S. PATENT DOCUMENTS 6,574,209 B1   6/2003  Kosaka
6,721,580 B1 * 4/2004  Moon ........................... 455/574

(Continued)

FOREIGN PATENT DOCUMENTS

CN   1725136   1/2006
JP   7-243693  9/1995

(Continued)

OTHER PUBLICATIONS

Office Action issued Aug. 20, 2013 in corresponding JP Application No. 2012-178214 (with English translation).

(Continued)

*Primary Examiner* — Benjamin C Lee
*Assistant Examiner* — Chico A Foxx
(74) *Attorney, Agent, or Firm* — Harness, Dickey & Pierce, PLC

(57) ABSTRACT

An emergency report apparatus in a vehicle transmits a signal of an emergency report to a center apparatus via a communication network when determining that the vehicle collides. The apparatus has a plurality functions for the emergency report with an operating power supplied from a vehicle battery in the vehicle. A backup battery is included to supply an operating power when the electric power supplied from the vehicle battery declines. A measurement device is included to measure a battery capability of the backup battery. A restriction device is included to restrict a function for the emergency report when the battery capability measured is lower than a predetermined value.

17 Claims, 7 Drawing Sheets

(51) Int. Cl.
  *G01R 19/165* (2006.01)
  *G01R 31/36* (2006.01)
  *G01R 31/00* (2006.01)

(56) References Cited

U.S. PATENT DOCUMENTS

| | | | |
|---|---|---|---|
| 2004/0075345 A1* | 4/2004 | Yoshioka et al. | 307/66 |
| 2005/0101287 A1 | 5/2005 | Jin et al. | |
| 2006/0016793 A1 | 1/2006 | Zhu et al. | |
| 2008/0122614 A1* | 5/2008 | Sakai | 340/539.18 |
| 2010/0035543 A1* | 2/2010 | Nishida | 455/12.1 |
| 2010/0144308 A1* | 6/2010 | Jin et al. | 455/404.1 |
| 2011/0080275 A1* | 4/2011 | Shimizu | 340/425.5 |
| 2011/0298427 A1* | 12/2011 | Uemura et al. | 320/134 |
| 2014/0037998 A1 | 2/2014 | Zhu et al. | |

FOREIGN PATENT DOCUMENTS

| | | |
|---|---|---|
| JP | 2002-343448 | 11/2002 |
| JP | 3589834 B2 | 8/2004 |
| JP | 2006-347299 | 12/2006 |
| JP | 2006-374299 | 12/2006 |
| JP | 2008-130007 | 6/2008 |
| JP | 2009-248794 | 10/2009 |
| JP | 2010-272302 | 12/2010 |

OTHER PUBLICATIONS

Office Action issued Nov. 3, 2014 in corresponding CN Application No. 201210414364.5 (with English translation).

* cited by examiner

FIG. 4

| RANK | VOLTAGE |
|---|---|
| A | V ≥ 3.5 |
| B | 3.5 > V ≥ 3 |
| C | 3 > V ≥ 2.5 |
| D | 2.5 > V |

FIG. 5

| RESTRICTED | BATTERY RANKS | | | |
|---|---|---|---|---|
| | A | B | C | D |
| REDUCE SOUNDS | — | ○ | ○ | ○ |
| STOP VOICE CALL | — | — | ○ | ○ |
| REDUCE TRANSMISSION | — | — | — | ○ |

FIG. 9

| ORDER | PROCESSES | EFFECT | TIME | ENVIRON/BATTERY |
|---|---|---|---|---|
| 1 | ACTIVATE M-COMP/ LEDS | VERY SMALL | 180s | − 40 TO −30 |
| 2 | ACTIVATE M-COMP/ AUDIO | SMALL | 60s | −30 TO −20 |
| 3 | TRANSMIT POSITION AT MINIMUM | MIDDLE | 3 TIMES | −20 TO −10 |
| 4 | TRANSIT POSITION AT HIGHER LEVEL | GREATER | 3 TIMES | −20 TO −10 |

IN-VEHICLE EMERGENCY REPORT APPARATUS

CROSS REFERENCE TO RELATED APPLICATION

The present application is based on Japanese Patent Applications No. 2011-235982 filed on Oct. 27, 2011, and 2012-178214 filed on Aug. 10, 2012, the disclosure of which is incorporated herein by reference.

TECHNICAL FIELD

The present disclosure relates to an in-vehicle emergency report apparatus to transmit an emergency report signal to a center apparatus.

BACKGROUND

An in-vehicle emergency report apparatus mounted in a vehicle has a backup battery including a rechargeable battery, such as a lithium ion battery, and operates with the backup battery even when a vehicle battery damages in a traffic accident, for instance. The backup battery has a characteristic that its discharge performance decreases at low temperatures. For example, the discharge performance at −30 degrees centigrade is about one-fourth that at 0 degrees centigrade. Thus, a vehicle needs to adopt a backup battery efficient enough to secure the discharging performance at low temperatures. Such a backup battery exhibits the discharge performance much higher than needed at usual temperatures, leading to high costs in usual usage (refer to JP 07-243693 A).

SUMMARY

It is an object of the present disclosure to provide an in-vehicle emergency report apparatus to allow a usage of a low-cost backup battery having a discharge performance that decreases significantly at low temperatures.

To achieve the above object, according to an aspect of the present disclosure, an in-vehicle emergency report apparatus in a vehicle is provided as follows. The apparatus transmits a signal of an emergency report to a center apparatus via a communication network when determining that the vehicle collides. The apparatus has a plurality of functions for the emergency report with an operating power that includes an electric power supplied from a vehicle battery mounted in the vehicle. The in-vehicle emergency report apparatus includes a backup battery and a measurement device, and a restriction device. The backup battery is to supply an operating power when the electric power supplied from the vehicle battery declines. The measurement device is to measure a battery capability of the backup battery. A restriction device is to restrict a function for the emergency report when the battery capability measured is lower than a predetermined value.

The above configuration allows a discharge performance of the backup battery at low temperatures to remain low, leading to adoption of a low-cost backup battery in the in-vehicle emergency report apparatus.

According to another aspect of the present disclosure, an in-vehicle emergency report apparatus in a vehicle is provided as follows. The apparatus transmits a signal of an emergency report to a center apparatus via a communication network when determining that the vehicle collides. The apparatus has a plurality of functions for the emergency report with an operating power that includes an electric power supplied from a vehicle battery mounted in the vehicle. The apparatus includes a backup battery, a battery temperature detector, and a heating controller. The backup battery is to supply an operating power when the electric power supplied from the vehicle battery declines. The battery temperature detector is to detect a temperature of the backup battery. The heating controller is to heat the backup battery by applying electric currents from the backup battery in cases that the temperature of the backup battery is lower than a first predetermined temperature when an ignition switch of the vehicle is turned into an on state.

BRIEF DESCRIPTION OF THE DRAWINGS

The above and other objects, features, and advantages of the present disclosure will become more apparent from the following detailed description made with reference to the accompanying drawings. In the drawings:

FIG. 4 is a diagram illustrating a relationship between battery capability ranks and detection voltages of the backup battery;

FIG. 5 is a diagram illustrating a relationship between battery capability ranks and restricted functions;

FIG. 9 is a diagram illustrating a self-heating recovery process.

DETAILED DESCRIPTION

First Embodiment

Figure 1:
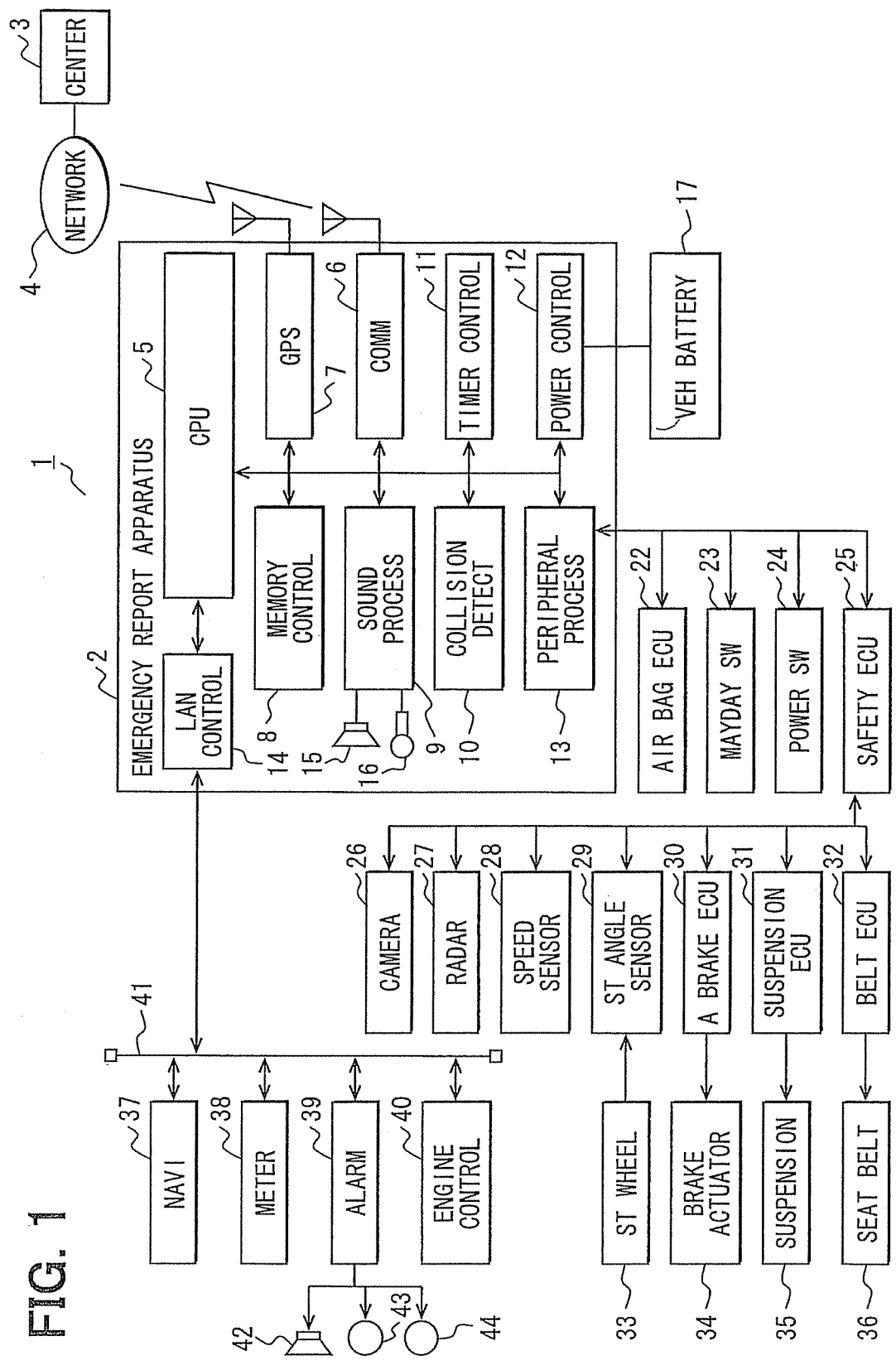
FIG. 1 is a functional block diagram of an overall configuration of an emergency report system according to a first embodiment of the present disclosure.

An emergency report system according to a first embodiment of the present invention will be explained with reference to FIGS. 1 to 5. With reference to FIG. 1, the emergency report system 1 includes an in-vehicle emergency report apparatus 2 in a subject vehicle and a center apparatus 3 in a service center, two of which communicate to each other via a communication network 4 including a mobile communication network and a fixed-lined communication network.

The in-vehicle emergency report apparatus 2 includes a central processing unit (CPU) 5, a wireless communicator 6, a global positioning system (GPS) positioning unit 7, a memory controller 8, a sound processor 9, a collision detector 10, a timer controller 11, a power controller 12, a peripheral processor 13, and an in-vehicle local area network (LAN) controller 14. The CPU 5 executes control programs to control overall operations of the in-vehicle emergency report apparatus 2 and functions as a restriction device or means.

The wireless communicator 6 controls the wireless communication with the center apparatus 3 via the communication network 4, and permits selectively voice calls or data communications between an occupant in the subject vehicle and an operator in the service center under the communication link connected. The wireless communicator 6 also functions as a transmission output controller to control variably a transmission power of the wireless communication depending on control signals from the CPU 5.

The GPS positioning unit 7 receives GPS signals from GPS Satellites, and acquires a present position of the subject vehicle using a parameter extracted from the GPS signals. The memory controller 8 controls storage of various kinds of information about the subject vehicle, a user or occupant of the subject vehicle, a present position of the subject vehicle acquired by the GPS positioning unit 7.

The sound processor 9 sound-processes (i) transmission sounds inputted via a microphone 15 and (ii) reception sounds to output via a speaker 16. The sound processor 9 also functions as a sound output controller to control variably sound outputs of reception sounds (call sounds or call voices) depending on control signals from the CPU 5. The timer controller 11 starts timing when receiving a start signal from the CPU 5 and ends the timing in a predetermined time, outputting a timing end signal to the CPU 5.

Figure 2:
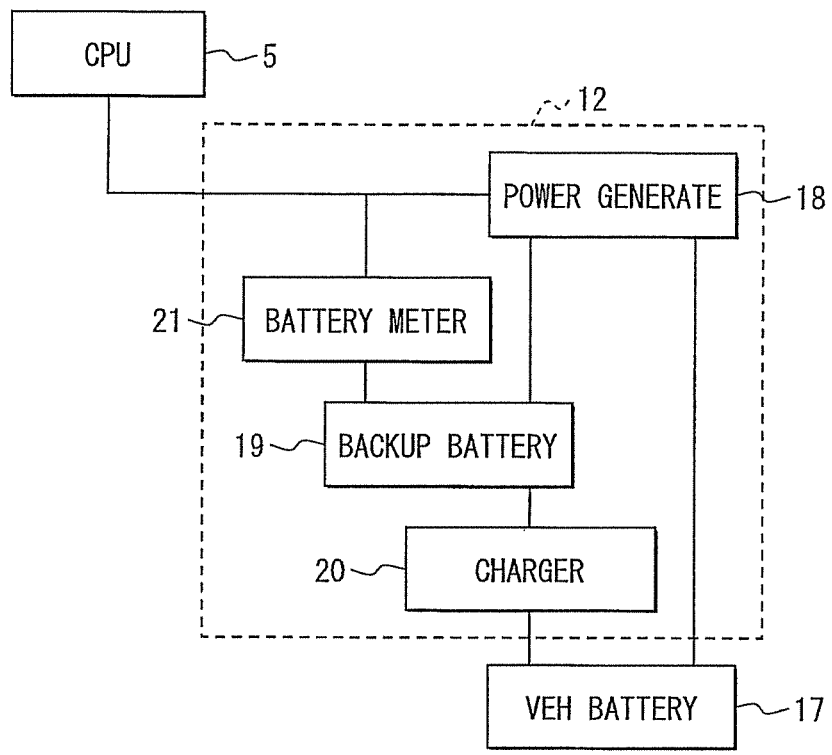
FIG. 2 is a functional block diagram of a power controller according to the first embodiment.

The power controller 12 functions to operate the in-vehicle emergency report apparatus 2 by supplying each functional block with an operating power supplied from a vehicle battery 17 mounted in the subject vehicle. With reference to FIG. 2, the power controller 12 includes a supply power generator 18, a backup battery 19, a charger 20, and a battery capability meter 21. The supply power generator 18 generates the electric power supplied to each functional block using an operating power from the vehicle battery 17. Further, the supply power generator 18 generates the electric power supplied to each functional block using an operating power from the backup battery 19 when the electric power supplied from the vehicle battery 17 decreases to a predetermined levels or stops, i.e., when the vehicle battery 17 damages.

The backup battery 19 includes a rechargeable battery, such as a lithium ion battery and a nickel hydrogen battery (also referred to as a nickel metal hydride battery), and is charged with the electric power from the vehicle battery 17 via the charger 20. The battery capability meter 21 functions as a measurement device or means to measure or detect a voltage of the backup battery 19 as a battery capability, such as battery capacity and discharging performance, and outputs a voltage detecting signal to the CPU 5.

The peripheral processor 13 connects with an air bag ECU 22, a Mayday switch 23, a power switch 24, and a pre-crash safety ECU 25. The ECU signifies an electronic control unit. The Mayday switch 23 may be also referred to as a help switch. The air bag ECU 22 connects with an air bag (unshown), and is able to expand the air bag while outputting an air bag expansion signal provided that the power switch 24 outputs an IG (ignition) signal being in an ON state. The Mayday switch 23 outputs a manipulation detecting signal when an occupant manipulates. The power switch 24 includes an ignition (IG) switch and an accessory (ACC) switch, and outputs an IG signal indicating an ON/OFF state of the IG switch and an ACC signal indicating an ON/OFF state of the ACC switch. The pre-crash safety ECU 25 connects with a camera 26, a millimeter-wave radar 27, a vehicle speed sensor 28, a steering angle sensor 29, a brake control ECU 30, an air suspension ECU 31, and a seat belt ECU 32.

The pre-crash safety ECU 25 determines whether the subject vehicle may collide with an obstacle or a vehicle ahead of the subject vehicle by analyzing various input signals on condition that the power switch 24 outputs an IG signal being in the ON state. The various input signals include video signals from the camera 26, radar detecting signals from the millimeter-wave radar 27, speed signals from the vehicle speed sensor 28, steering angle signals indicating angles of a steering wheel 33 from the steering angle sensor 29. When determining that the vehicle may collide, the pre-crash safety ECU 25 outputs pre-crash detecting signals.

When outputting the pre-crash detecting signals, the pre-crash safety ECU 25 activates a brake actuator 34 via the brake control ECU 30, activates an air suspension 35 via the air suspension ECU 31, and fastens tightly a seat belt 36 via the seat belt ECU 32, preparing to soften an impact from a possible vehicle collision. In addition, the pre-crash safety ECU 25 also connects with a combined instrument panel (not shown) to display a warning when determining that the vehicle may collide.

The vehicle LAN controller 14 communicates various signals with a navigation apparatus 37, a meter apparatus 38, an alarm apparatus 39, and an engine control apparatus 40 via the in-vehicle LAN 41, operating the apparatuses 37 to 40. Further, the alarm apparatus 39 connects with a horn 42, a headlight 43, and a hazard flasher 44.

Figure 3:
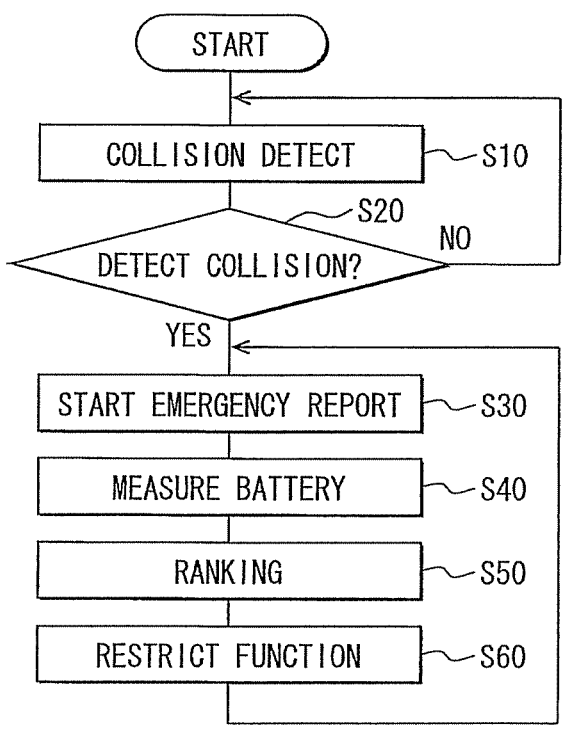
FIG. 3 is a flowchart illustrating a control process of an in-vehicle emergency report apparatus according to the first embodiment.

The following will explain an operation of the in-vehicle emergency report apparatus 2, and specifically a control process executed by the in-vehicle emergency report apparatus 2 in response to a detection result of the battery capability of the backup battery 19 with reference to FIGS. 3, 4, 5. It is further noted that a flowchart in the present application includes sections (also referred to as steps), which are represented, for instance, as S10. Further, each section can be divided into several sub-sections while several sections can be combined into a single section. Furthermore, each of thus configured sections can be referred to as a device, module, processor, or means and achieved not only (i) as a software section in combination with a hardware unit (e.g., computer), but also (ii) as a hardware section, including or not including a function of a related apparatus. Further, the hardware section may be inside of a microcomputer.

With reference to FIG. 3, at S10, the CPU 5 executes a collision detection process for the subject vehicle. Specifically, receiving a pre-crash detecting signal from the pre-crash safety ECU 25 leads to determining a vehicle collision possibility. The wireless communication link is thereby connected between the wireless communicator 6 of the emergency report apparatus 2 and the center apparatus 3. Receiving an air bag expansion signal from the air bag ECU 22 leads to determining an occurrence of a vehicle collision, corresponding to "YES" at S20. At S30, an emergency report process starts to transmit information from the emergency report apparatus 2 to the center 3. The information transmitted includes occupant information, vehicle information, and a newest vehicle position.

When not receiving an air bag expansion signal from the air bag ECU 22 within a predetermined time after determining the vehicle collision possibility, it is determined that the vehicle did not collide, which corresponding to "NO" at S20, disconnecting the wireless communication link between the wireless communicator 6 and the center apparatus 3. The processing returns to S10, repeating the collision detection process.

After starting the emergency report process at S30, the processing proceeds to S40, where the battery capability meter 21 detects a battery capability of the backup battery 19 such as a voltage. At S50, the voltage detected permits classifying or ranking the backup battery 19 into one of battery capability ranks. With reference to FIG. 4, a voltage range of voltage detected>=3.5 belongs to RANK A that may be also referred to a highest rank; a voltage range of 3.5>voltage detected>=3.0 belongs to RANK B that may be also referred to a second highest rank; a voltage range of 3.0>voltage detected>=2.5 belongs to RANK C that may be also referred to a third highest rank; and a voltage range of 2.5>voltage detected belongs to RANK D that may be referred to as a lowest rank.

At S60, functions of the in-vehicle emergency report apparatus 2 are restricted based on the ranks of the battery capability; the functions restricted may include an in-vehicle LAN communication, a GPS communication, a wireless communication, and a voice output. The functions restricted may be related to performances or operations. For instance, specifically, the functions restricted include a call-sound output reduction, a voice call stop, and a wireless communicator power reduction. With reference to FIG. 5, the rank A of the battery capability does not restrict any function. The rank B performs the call-sound output reduction. The rank C performs the call-sound output reduction and the voice call stop. The rank D performs the call-sound output reduction, the voice call stop, and the wireless communicator electric power reduction. The processing then returns to S30, repeating the emergency report process.

In other words, each rank is provided with a restriction list to include functions that are restricted by the in-vehicle emergency apparatus 2. For instance, the rank A has a restriction list to include no function to be restricted. The rank B has a restriction list to include the call-sound output reduction. The rank C has a restriction list to include the call-sound output reduction and the voice call stop. The rank D has a restriction list to include the call-sound output reduction, the voice call stop, and the wireless communicator electric power reduction. Thus, when a higher rank is higher than a lower rank by one rank, the reference list of the lower rank is provided by adding one function that is restricted to the reference list of the higher rank.

A featured configuration of the first embodiment is provided as follows. A voltage of the backup battery 19 is detected as a battery capability. The backup battery 19 is ranked into one of the battery capability ranks based on the voltage detected. The functions or performances of the emergency report apparatus 2 are restricted selectively depending on the battery capability ranks. The battery capability or discharging performance of the backup battery 19 may decline due to low temperatures. In such a case, functions or performances of the emergency report apparatus 2 are restricted selectively depending on degrees of the voltage decline or battery capability ranks, enabling the consumed electric power to decrease. The above featured configuration may permit specifying the discharge performance or voltage of the backup battery 19 at a predetermined low temperature to be lower than a conventional in-vehicle emergency report apparatus not including the featured configuration of the first embodiment of the present disclosure, therefore, enabling the use of a low-cost backup battery 19.

In the above embodiment, the battery capability of the backup battery 19 is classified into four ranks. Alternatively, it may be classified into three or fewer ranks or more than four ranks as needed. In addition, specific voltage ranges corresponding to the respective ranks may be changed suitably. In addition, the functions restricted in the emergency report apparatus 2 include the call-sound output reduction, the voice call stop, and the wireless communicator power reduction, which are relating to an emergency report. Without need to be limited thereto, another function may be restricted.

Second Embodiment

Figure 6:
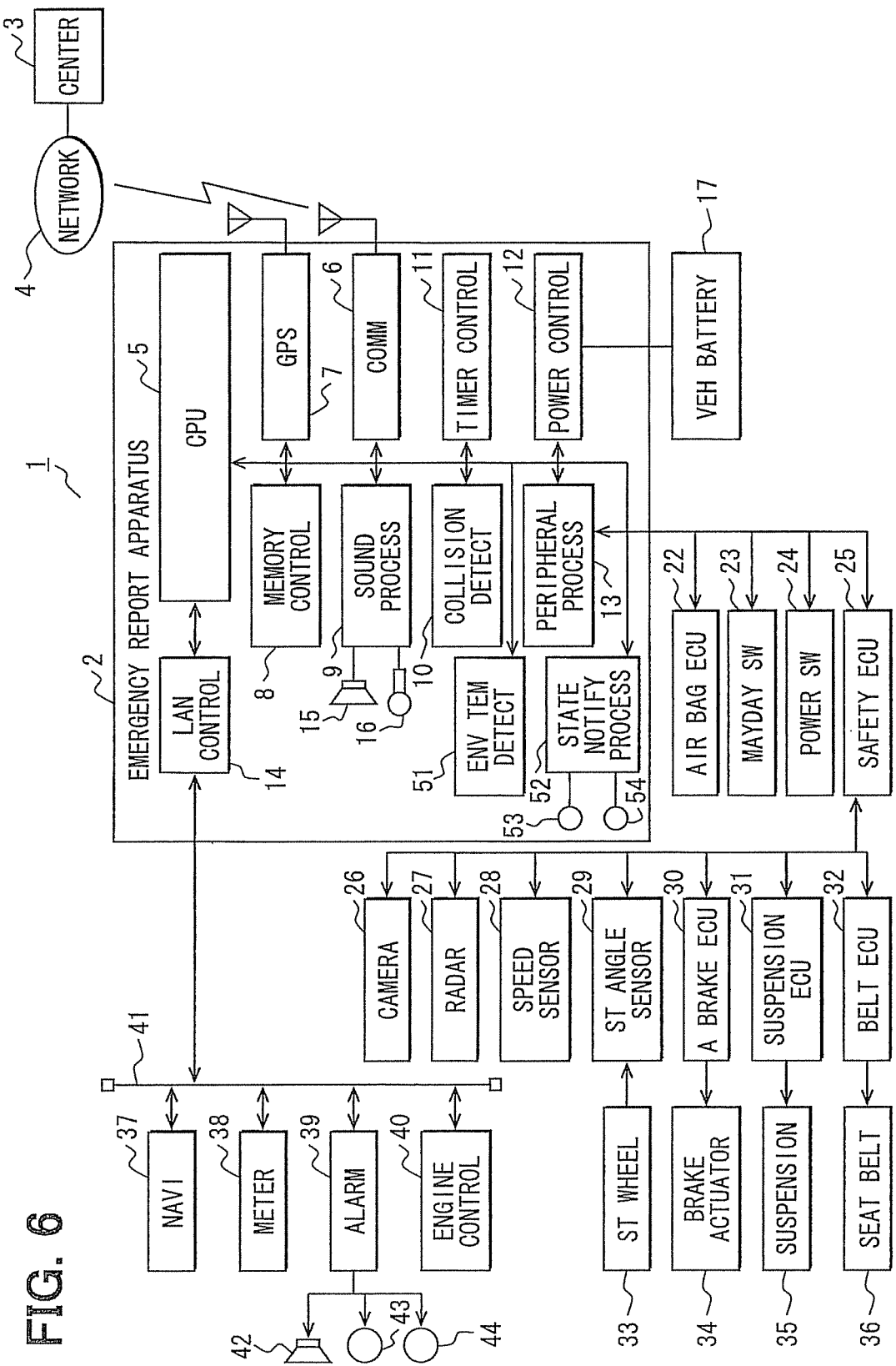
FIG. 6 is a functional block diagram of an overall configuration of an in-vehicle emergency report apparatus according to a second embodiment of the present disclosure.

A second embodiment of the present disclosure will be explained with reference to FIGS. 6 to 9. It is noted that the same constituents of the configuration as those of the first embodiment are assigned with the same reference signs or numbers. With reference to FIG. 6, the in-vehicle emergency report apparatus 2 according to the second embodiment further includes an environmental temperature detector 51 and a state notification processor 52. The environmental temperature detector 51 may be also referred to as an environment temperature detection device or means. The environmental temperature detector 51 includes a temperature sensor, such as a thermistor, to detect or measure a temperature of an environment where the in-vehicle emergency report apparatus 2 is mounted or the backup battery is disposed, and outputs a temperature detecting signal to the CPU 5.

The state notification processor 52 drives to light two light-emitting diodes (LEDs) 53, 54 for notifying users of an operating state of the in-vehicle emergency report apparatus 2 depending on control signals from the CPU 5. The LED 53 is a red LED; the LED 54 is a blue LED. The first embodiment may be desirably provided with the state notification processor 52 and the LEDs 53, 54.

Figure 7:
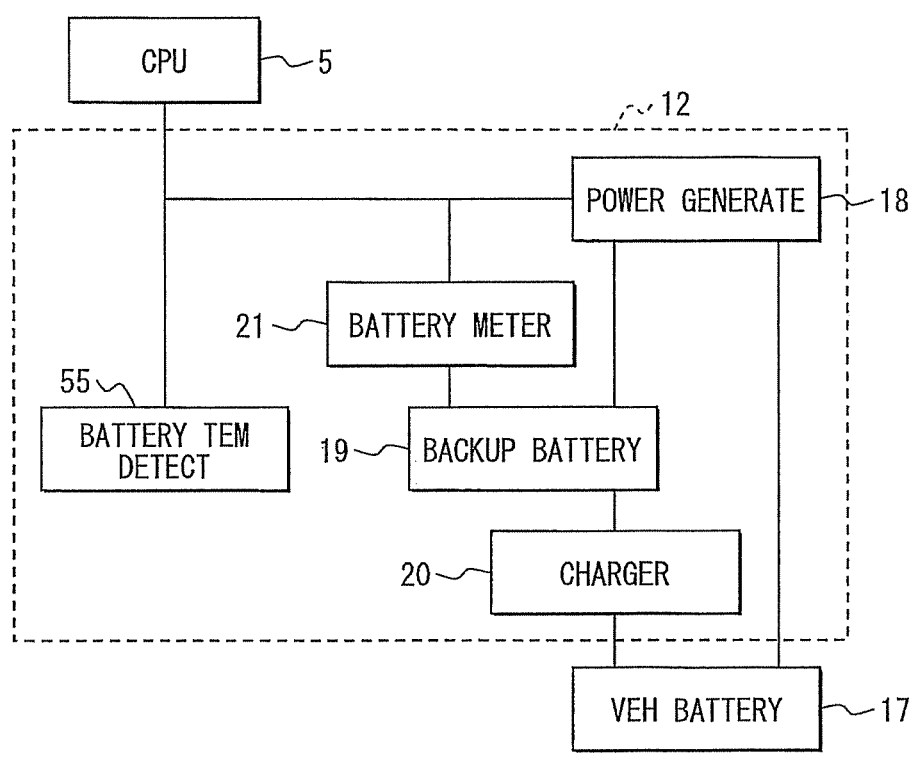
FIG. 7 is a functional block diagram of a power controller according to the second embodiment.

With reference to FIG. 7, the power controller 12 of the in-vehicle emergency report apparatus 2 includes a battery temperature detector 55 which detects or measures a temperature of the backup battery 19. The battery temperature detector 55 may be also referred to as a battery temperature detection device or means. The battery temperature detector 55 includes a temperature sensor, such as a thermistor, to detect or measure a temperature of the backup battery 19, and outputs a temperature detecting signal to the CPU 5. The in-vehicle emergency report apparatus 2 or the CPU 5 also functions as a heating controller or a heating device or means.

In addition, the in-vehicle emergency report apparatus 2 of the present embodiment has a remote engine start function. That is, a user manipulates a remote terminal or wireless terminal such as a cellular phone and a smart phone (none shown), transmitting a remote engine start signal, which is a signal for starting an engine of the subject vehicle by remote manipulation, to the in-vehicle emergency report apparatus 2 via the communication network 4. Upon receiving the remote engine start signal, the wireless communicator 6 of the in-vehicle emergency report apparatus 2 transmits the signal received to the CPU 5. The CPU 5 transmits the above remote engine start signal to the engine control apparatus 40 via the in-vehicle LAN controller 14 and the in-vehicle LAN 41. Upon receiving the remote engine start signal, the engine control apparatus 40 starts the engine of the vehicle.

Figure 8:
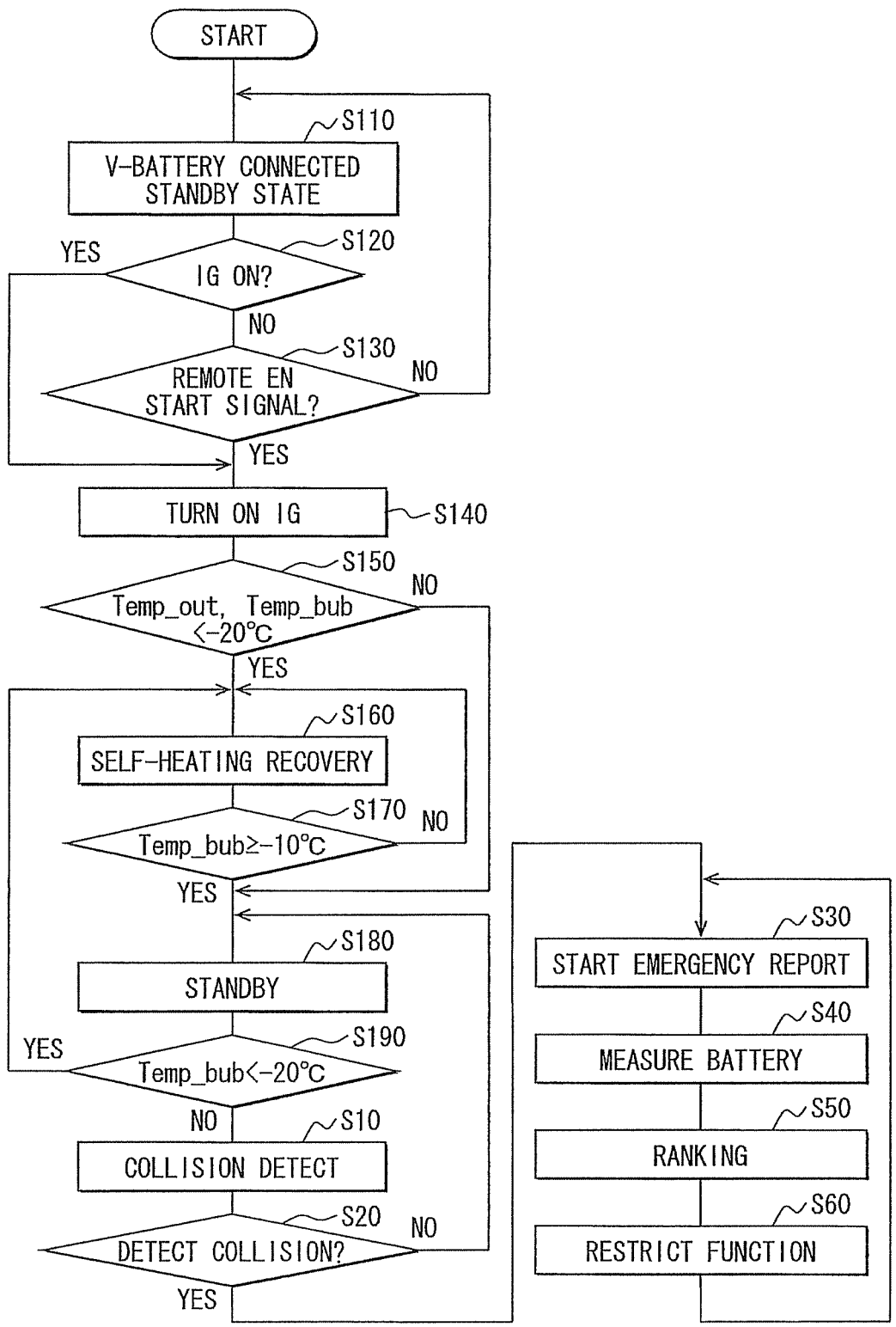
FIG. 8 is a flowchart illustrating a control process of the in-vehicle emergency report apparatus according to the second embodiment.

The following will explain an operation of the in-vehicle emergency report apparatus 2 according to the second embodiment with reference to FIGS. 8, 9. With reference to FIG. 8, at S110, the in-vehicle emergency report apparatus 2 is in a vehicle-battery connected standby state, which is a standby state where the apparatus 2 is connected to the vehicle battery 17 with a minimum electricity consumption. At S120, it is determined whether the ignition switch (IG) is turned in the ON state. When the ignition switch is not in the ON state, the processing proceeds to S130, where it is determined whether a remote engine start signal is received. When not receiving a remote engine start signal, the processing returns to S110, where the apparatus 2 continues to be in the vehicle-battery connected standby state.

When the ignition switch is turned into the ON state at S120, or when the remote engine start signal is received, the processing proceeds to S140. At S140, a process at the IG switch turned into the ON state operates. In such a case, the in-vehicle emergency report apparatus 2 switches from the vehicle-battery connected standby state into a usual powered-on state.

At S150, it is determined whether either an environment temperature Temp_out detected by the environmental temperature detector 51 or a battery temperature Temp_bub of the backup battery 19 detected by the battery temperature detector 55 is lower than −20 degrees centigrade that is a first predetermined temperature. When the environmental temperature Temp_out or battery temperature Temp_bub is lower than −20 degree centigrade, the processing proceeds to S160, where a self-heating recovery process to be explained later is executed to increase the battery temperature Temp_bub of the backup battery 19 in order to recover the function of the backup battery 19 at low temperatures. It is noted that before an engine start, the environmental temperature Temp_out and the battery temperature Temp_bub are usually similar to each other; after the engine start, the battery temperature Temp_bub usually becomes higher than the environmental temperature Temp_out.

At S170, it is determined whether the battery temperature Temp_bub is equal to or higher than −10 degrees centigrade. When the battery temperature Temp_bub is lower than −10 degrees centigrade, the processing returns to S160. In contrast, when the battery temperature Temp_bub is equal to or higher than −10 degrees centigrade, the processing proceeds to S180, where the in-vehicle emergency report apparatus 2 is moved to a standby state.

When the environmental temperature Temp_out or battery temperature Temp_bub is not lower than −20 degrees centigrade, the processing proceeds to S180, where the in-vehicle emergency report apparatus 2 is switched to the standby state.

The self-heating recovery process at S160 will be specifically explained with reference to FIG. 9. In the self-heating recovery process, different processes indicated in FIG. 9 operate selectively depending on the environmental temperature Temp_out and the battery temperature Temp_bub. First, when the environmental temperature Temp_out or the battery temperature Temp_bub, whichever is higher, is within higher than −40 degrees centigrade and lower than −30 degrees centigrade, the first process in FIG. 9 starts which is a non-operative state notification to activate a microcomputer (e.g., the CPU 5) of the in-vehicle emergency report apparatus 2 with a usual electric current and light two LEDs 53, 54, notifying an occupant of the non-operating state of the in-vehicle emergency apparatus 2. The LEDs 53, 54 continues lighting for 180 seconds, for instance. The first process has a load needing a very small consumed electric current, providing a very small restorative effect from the self-heating of the backup battery 19.

Second, when the environmental temperature Temp_out or the battery temperature Temp_bub, whichever is higher, is within higher than −30 degrees centigrade and lower than −20 degrees centigrade, the second process in FIG. 9 starts which is a non-operative state notification to activate the microcomputer of the in-vehicle emergency report apparatus 2 with a usual electric current and activate the speaker 16 for outputting sounds such as a notice sound, notifying an occupant of the non-operating state of the in-vehicle emergency apparatus 2. The speaker 16 continues outputting for 60 seconds, for instance. The second process has a load needing a small consumed electric current, providing a small restorative effect from the self-heating of the backup battery 19.

The first or second process may increase the battery temperature Temp_bub. Then, when the environmental temperature Temp_out or the battery temperature Temp_bub, whichever is higher, is within higher than −20 degrees centigrade and lower than −10 degrees centigrade, the third process in FIG. 9 starts which is a position notification to activate a network access device (NAD) of the wireless communicator 6 and the GPS positioning unit 7, notifying the center apparatus 3 or wireless base station of the position information on present position of the subject vehicle with a minimum transmission power. Such position notification is repeated three times, for instance. The third process has a load needing a moderate consumed electric current, providing a moderate restorative effect from the self-heating of the backup battery 19.

Further, after the third process operated to transmit the position information to the center apparatus 3, the apparatus 2 may not receive a response. In this case, the fourth process in FIG. 9 operates which transmits the position information to the center apparatus 3 with a transmission power increased by one level. The fourth process has a load needing a consumed electric current higher than that of the third process by one level, providing a restorative effect, which is higher than that of the third process by one level, from the self-heating of the backup battery 19. It is noted that both the environmental temperature Temp_out and the battery temperature Temp_bub are lower than −40 degrees centigrade, the self-heating recovery process does not operate.

After the standby state at S180, it is determined at S190 whether the battery temperature Temp_bub of the backup battery 19 is lower than −20 degrees centigrade. When the battery temperature Temp_bub of the backup battery 19 is lower than −20 degrees centigrade, the processing returns to S160 to repeat the self-heating recovery process. This may take place due to a low environment temperature.

In addition, when the battery temperature Temp_bub is not lower than −20 degrees centigrade, the processing proceeds to S10, executing the collision detection process explained in the first embodiment. The processing at S20 to S60 is the same as that of the first embodiment except at S20. That is, when the collision is not detected at S20, the processing returns to S180.

The other configuration of the second embodiment except the mentioned above is the same as that of the first embodiment. Therefore, the second embodiment provides almost the same advantage as the first embodiment does. In particular, the second embodiment has a featured configuration as follows. When the ignition switch (IG) is turned into the ON state or the remote engine start signal is received, it is determined whether the environmental temperature Temp_out or the battery temperature Temp_bub is lower than −20 degrees centigrade. When such a determination is affirmative, the self-heating recovery process of the backup battery 19 operates, thereby restoring the function of the backup battery 19 at a low environmental temperature. The above featured configuration may permits specifying the discharge performance or voltage of the backup battery 19 at a predetermined low temperature to be lower than a conventional in-vehicle emergency report apparatus not including the featured configuration of the second embodiment of the present disclosure, therefore, enabling the use of a low-cost backup battery 19.

Operating the self-heating recovery process consumes a little electric power charged in the backup battery 19. However, the backup battery 19 may be re-charged by the vehicle battery 17 during the standby state of the in-vehicle emergency report apparatus 2 at S180 in FIG. 8, not posing a problem.

Further, in the above second embodiment, the in-vehicle emergency report apparatus 2 has a remote engine start function. Without need to be limited thereto, another different in-vehicle apparatus other than the in-vehicle emergency report apparatus 2 may have a remote engine start function. The different in-vehicle apparatus may transmit the remote engine start signal received to the in-vehicle emergency report apparatus 2. In addition, the subject vehicle may not have a remote engine start function. In such a case, in FIG. 8, S130 is deleted while the determination at S120 is negative, the processing returns to S110.

Further, in the above second embodiment, the first process of the self-heating recovery process lights two LEDs 53, 54. Without need to be limited thereto, the LEDs 53, 54 may flash with the lighting-up time and lighting-out time suitably changed. This enables the consumed electric current or the self-heating of the backup battery 19 to vary finely.

Further, in the above second embodiment, the self-heating recovery process in the second process activates the speaker 16 to output sounds such as a notice sound. In this case, the speaker 16 may operate with a sound volume variable. This enables the consumed electric current or the self-heating of the backup battery 19 to vary finely.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An in-vehicle emergency report apparatus in a vehicle, the apparatus transmitting a signal of an emergency report to a center apparatus, as an emergency reporting, via a communication network when determining that the vehicle collides, the apparatus having a plurality of functions for the emergency report with an operating power that includes an electric power supplied from a vehicle battery mounted in the vehicle, the in-vehicle emergency report apparatus comprising:
a backup battery to supply an operating power when the electric power supplied from the vehicle battery declines, the backup battery being a rechargeable battery that is charged with the electric power supplied from the vehicle battery;
a measurement device to measure a battery capability of the backup battery; and
a restriction device to restrict a function for the emergency report when the battery capability measured is lower than a predetermined value;
a battery temperature detector to detect a temperature of the backup battery; and
a heating controller to
determine, if an ignition switch of the vehicle is turned into an on state and, whether the detected temperature of the backup battery is lower than a first predetermined temperature, and
heat, upon determining that the detected temperature of the backup battery is lower than the first predetermined temperature, the backup battery due to a self-heating process of the backup battery itself, wherein the self-heating process is separate from the emergency reporting, by applying electric currents from the backup battery to a plurality of loads for various time periods, said self-heating process comprises heat generated inside the backup battery itself when the backup battery is running, wherein
in cases that the detected temperature of the backup battery is lower than the first predetermined temperature when the ignition switch of the vehicle is turned into the on state, the heating controller classifies the detected temperature of the backup battery into one of a plurality of temperature ranges lower than the first predetermined temperature, and
as the detected temperature of the backup battery is classified into a lower temperature range among the plurality of temperature ranges, the heating controller applies the electric currents from the backup battery to a load of said plurality of loads of which consumed electric current is smaller,
whereas as the detected temperature of the backup battery is classified into a higher temperature range among the plurality of temperature ranges, the heating controller applies the electric currents from the backup battery to a load of said plurality of loads of which consumed electric current is larger.

2. The in-vehicle emergency report apparatus according to claim 1, wherein
the measurement device measures as the battery capability a voltage of the backup battery.

3. The in-vehicle emergency report apparatus according to claim 2, wherein:
the restriction device ranks the voltage measured by the measurement device into one of a plurality of ranks from a highest rank corresponding a highest voltage range that is not lower than the predetermined value to a lowest rank corresponding to a lowest voltage range;
when the voltage measured is ranked into the highest rank, the restriction device restricts no function of the plurality of functions for the emergency report; and
when the voltage measured is ranked into other ranks other than the highest rank, the restriction device restricts at least one function among the plurality of functions for the emergency report.

4. The in-vehicle emergency report apparatus according to claim 3, wherein:
when the voltage measured is ranked into a second highest rank next to the highest rank, the restriction device restricts one function among the plurality of functions for the emergency report; and
when at a subject rank lower than the second highest rank, the restriction device restricts one function in addition to functions restricted at a rank higher than the subject rank by one rank.

5. The in-vehicle emergency report apparatus according to claim 2, wherein:
the restriction device defines a plurality of ranks depending on ranges of a voltage of the backup battery, the ranks being from a highest rank corresponding a highest voltage range that is not lower than the predetermined value to a lowest rank corresponding to a lowest voltage range;
the restriction device provides a restriction list with respect to each of the ranks to include a function that is restricted by the restriction device;
the restriction list of the highest rank includes no function that is restricted; and
the restriction list of each of other ranks other than the highest rank includes at least one function that is restricted by the restriction device.

6. The in-vehicle emergency report apparatus according to claim 5, wherein:
the restriction list of a second highest rank lower than the highest rank by one rank includes one function among the plurality of functions for the emergency report; and
the restriction list of a lower rank that is lower than a higher rank by one rank is provided by adding a function to the restriction list of the higher rank.

7. The in-vehicle emergency report apparatus according to claim 6, wherein
the plurality of ranks include four ranks;
when the voltage measured is ranked into the second highest rank, the restriction device reduces an output of a call sound for the emergency report process;
when the voltage measured is ranked into a third highest rank next to the second highest rank, the restriction device stops a voice call in addition to the reducing the output of the call sound; and
when the voltage measured is ranked into the lowest rank next to the third highest rank, the restriction device reduces an electric power of a wireless communicator that transmits the signal of the emergency report to the center apparatus in addition to the reducing the output of the call sound and the stopping the voice call.

8. The in-vehicle emergency report apparatus according to claim 1, wherein
the backup battery includes one of a lithium ion battery and a nickel metal hydride battery.

9. The in-vehicle emergency report apparatus according to claim 1, wherein:
upon receiving a signal for remotely starting an engine of the vehicle, the heating controller heats the backup battery by applying electric currents from the backup battery.

10. The in-vehicle emergency report apparatus according to claim 1, wherein:
the heating controller stops heating the backup battery when the temperature detected of the backup battery is higher than a second predetermined temperature.

11. The in-vehicle emergency report apparatus according to claim 10, wherein:
when the temperature detected of the backup battery becomes again lower than the first predetermined temperature after stopping heating the backup battery, the heating controller re-heats the backup battery.

12. The in-vehicle emergency report apparatus according to claim 1, further comprising:
a battery temperature detector to detect a temperature of the backup battery;
an environmental temperature detector to detect a temperature of an environment of the backup battery; and
a heating controller to heat the backup battery by applying electric currents from the backup battery in cases that the temperature detected of the backup battery or the temperature detected of the environment is lower than a first predetermined temperature when (i) an ignition switch of the vehicle is turned into an on state or (ii) a signal for remotely starting an engine of the vehicle is received.

13. The in-vehicle emergency report apparatus according to claim 1, wherein the in-vehicle emergency report apparatus determines whether a remote engine start signal is received when the ignition switch of the vehicle is not turned into the on state.

14. An in-vehicle emergency report apparatus in a vehicle, the apparatus transmitting a signal of an emergency report to a center apparatus via a communication network when determining that the vehicle collides, the apparatus having a plurality of functions for the emergency report with an operating power that includes an electric power supplied from a vehicle battery mounted in the vehicle,
the in-vehicle emergency report apparatus comprising:
a backup battery to supply an operating power when the electric power supplied from the vehicle battery declines,
a battery temperature detector to detect a temperature of the backup battery; and
a heating controller to
determine, if an ignition switch of the vehicle is turned into an on state and, whether the detected temperature of the backup battery is lower than a first predetermined temperature, and
heat, upon determining that the detected temperature of the backup battery is lower than the first predetermined temperature, the backup battery due to a self-heating process of the backup battery itself, wherein the self-heating process is separate from the emergency reporting, by applying electric currents from the backup battery to a plurality of loads for various time periods, said self-heating process comprises heat generated inside the backup battery itself when the backup battery is running, wherein
in cases that the detected temperature of the backup battery is lower than the first predetermined temperature when the ignition switch of the vehicle is turned into the on state, the heating controller classifies the detected temperature of the backup battery into one of a plurality of temperature ranges lower than the first predetermined temperature, and
as the detected temperature of the backup battery is classified into a lower temperature range among the plurality of temperature ranges, the heating controller applies the electric currents from the backup battery to a load of said plurality of loads of which consumed electric current is smaller,
whereas as the detected temperature of the backup battery is classified into a higher temperature range among the plurality of temperature ranges, the heating controller applies the electric currents from the backup batter to a load of said plurality of loads of which consumed electric current is larger.

15. The in-vehicle emergency report apparatus according to claim 14, wherein
upon receiving a signal for remotely starting an engine of the vehicle, the heating controller heats the backup battery by applying electric currents from the backup battery.

16. The in-vehicle emergency report apparatus according to claim 14, wherein:
the heating controller stops heating the backup battery when the temperature of the backup battery is higher than a second predetermined temperature.

17. The in-vehicle emergency report apparatus according to claim 16, wherein
when the temperature of the backup battery becomes again lower than the first predetermined temperature after stopping heating the backup battery, the heating controller re-heats the backup battery.

* * * * *